(12) United States Patent
Zhang et al.

(10) Patent No.: US 9,875,674 B2
(45) Date of Patent: Jan. 23, 2018

(54) DRIVER IC, DISPLAY DEVICE, AND INSPECTION SYSTEM

(71) Applicant: Japan Display Inc., Tokyo (JP)

(72) Inventors: Chunhan Zhang, Tokyo (JP);
Yoshihiro Kotani, Tokyo (JP)

(73) Assignee: Japan Display Inc., Tokyo (JP)

( * ) Notice: Subject to any disclaimer, the term of this patent is extended or adjusted under 35 U.S.C. 154(b) by 535 days.

(21) Appl. No.: 14/474,563

(22) Filed: Sep. 2, 2014

(65) Prior Publication Data

US 2015/0061723 A1    Mar. 5, 2015

(30) Foreign Application Priority Data

Sep. 3, 2013    (JP) ................... 2013-182143

(51) Int. Cl.
*H01L 23/498*    (2006.01)
*G09G 3/00*    (2006.01)
(Continued)

(52) U.S. Cl.
CPC ......... *G09G 3/006* (2013.01); *G02F 1/13454* (2013.01); *G02F 1/13458* (2013.01); *H01L 22/34* (2013.01); *G02F 2203/69* (2013.01); *H01L 24/13* (2013.01); *H01L 24/14* (2013.01); *H01L 24/16* (2013.01); *H01L 24/27* (2013.01); *H01L 24/29* (2013.01); *H01L 24/32* (2013.01); *H01L 24/81* (2013.01); *H01L 24/83* (2013.01); *H01L 24/92* (2013.01); *H01L 2224/13013* (2013.01); *H01L 2224/14153* (2013.01); *H01L 2224/14155* (2013.01); *H01L 2224/16227* (2013.01); *H01L 2224/27334* (2013.01); *H01L 2224/293* (2013.01); *H01L 2224/2929* (2013.01); *H01L 2224/32225* (2013.01); *H01L 2224/81191* (2013.01); *H01L 2224/81903* (2013.01); *H01L 2224/83192* (2013.01); *H01L 2224/83203* (2013.01); *H01L 2224/83851* (2013.01); *H01L 2224/9212* (2013.01);
(Continued)

(58) Field of Classification Search
CPC .................... G09G 3/006; H01L 22/34; H01L 2924/3511; H01L 2224/83203; H01L 24/13; H01L 24/32; H01L 2224/14155; H01L 2224/293; G02F 1/13458; G02F 1/13454
See application file for complete search history.

(56) References Cited

U.S. PATENT DOCUMENTS 7,245,012 B2 *   7/2007   Chen ................. H01L 23/49816
                                                       257/737
9,377,635 B2 *   6/2016   Kim ...................... G02F 1/1309
(Continued)

FOREIGN PATENT DOCUMENTS

JP        2008-251828 A    10/2008

*Primary Examiner* — Jermele M Hollington
*Assistant Examiner* — Zannatul Ferdous
(74) *Attorney, Agent, or Firm* — Ulmer & Berne LLP (57) ABSTRACT

A display device includes, on a TFT substrate, a driver IC having a first bump and a second bump, a first terminal and a second terminal connecting respectively to the first bump and the second bump, and wiring interconnecting the first terminal and the second terminal. The driver IC also includes a resistance detection circuit that detects resistance between the first bump and the second bump.

18 Claims, 10 Drawing Sheets

(51) Int. Cl.
*H01L 27/12* (2006.01)
*G02F 1/1345* (2006.01)
*H01L 21/66* (2006.01)
*H01L 23/00* (2006.01)

(52) U.S. Cl.
CPC ............... *H01L 2924/15788* (2013.01); *H01L 2924/3511* (2013.01)

(56) References Cited

U.S. PATENT DOCUMENTS

| | | | | |
|---|---|---|---|---|
| 2005/0167833 A1* | 8/2005 | Kobayashi | .......... | G02F 1/13452 257/738 |
| 2010/0184309 A1* | 7/2010 | Huynh | ............... | H01R 13/2428 439/66 |
| 2010/0328259 A1* | 12/2010 | Ishizaki | ................. | G06F 3/044 345/174 |
| 2013/0335940 A1* | 12/2013 | Matsui | .................... | H01L 24/16 361/783 |
| 2014/0117998 A1* | 5/2014 | Hwang | ................. | G09G 3/006 324/511 |

* cited by examiner

DRIVER IC, DISPLAY DEVICE, AND INSPECTION SYSTEM

CLAIM OF PRIORITY

The present application claims priority from Japanese patent application JP2013-182143 filed on Sep. 3, 2013, the content of which is hereby incorporated by reference into this application.

BACKGROUND

The present invention relates to display devices. The invention is also directed to a technique applicable to display devices each including a driver IC mounted thereon by means of COG bonding.

In liquid-crystal display devices, a plurality of terminals connected to electrodes for applying a driving voltage to liquid crystals, and a plurality of terminals that accept signal lines extending from an external region of a liquid-crystal display panel are formed on a TFT substrate (glass substrate). A driver IC (semiconductor integrated circuit chip) that supplies a driving signal to the electrodes is connected to the former terminals by means of chip-on-glass (COG) bonding. During the COG bonding, an anisotropic conductive film (ACF) that functions as an adhesive, a thermosetting resin or the like laden with electrically conductive particles, is used to electrically interconnect the driver IC and the terminals on the TFT substrate. Bumps are disposed as connection terminals on a side of the driver IC that faces the TFT substrate.

Chip-on-glass (COG) bonding is performed in the following manner: The ACF is overlaid over the plurality of terminal regions of the TFT substrate on which the driver IC is to be mounted, and then after the bumps on the driver IC have been fitted to the terminals on the TFT substrate, a compression bonding head presses the driver IC toward the TFT substrate while heating the IC. This compression of the driver IC under heat spreads the ACF along an upper surface of the TFT substrate. While electrical conduction between the bumps and the terminals on the TFT substrate is being established by the electroconductive particles included in the ACF, the driver IC is mechanically connected to the TFT substrate with the use of the resin in the ACF.

The driver IC is preferably compressed by the compression bonding head when the driver IC is parallel at its lower surface with respect to the upper surface of the TFT substrate. However, if the lower surface of the driver IC is not parallel to the upper surface of the TFT substrate during the compression, there could be partial improper electrical connection between the bumps and the terminals on the TFT substrate.

JP-2008-251828-A (hereinafter referred to as Patent Document 1) discloses measuring resistance between signal input monitoring terminals and signal output monitoring terminals before compressively bonding a driver IC to ensure that an equal force is applied to the driver IC. More specifically, a substrate on which the driver IC is to be mounted includes a signal input monitoring terminal, a signal output monitoring terminal, and a wiring pattern lying between the signal input monitoring terminal and the signal output monitoring terminal. On the substrate the monitoring terminals and the wiring pattern are arranged in four sets in places corresponding to four corners of the driver IC. The wiring patterns are each formed so that when a first bump for monitoring use electrically connects to the signal input monitoring terminals and a second bump for monitoring use electrically connects to the signal output monitoring terminals, electrical connection is established between the signal input monitoring terminals and the signal output monitoring terminals. Resistance values are measured after a total of eight measuring pins have been applied to the four sets of signal input monitoring terminals and signal output monitoring terminals. The balance between the two kinds of monitoring terminals is adjusted in accordance with the timing at which the four resistance values between the signal input monitoring terminals and the signal output monitoring terminals change.

SUMMARY

As the driver IC decreases in film thickness, the driver IC tends to deflect during compression bonding and thus to decrease in a degree of compression bond at an outer region of an output-side bump that faces a display region. Glass stressing tends to deflect a long side of the driver IC, hence resulting in weak compression bonding at the outer region of the bump. If the compression bond at the bump is not strong enough, inactivation or malfunctioning of the display device could be caused since electrical conduction will not be obtainable. At manufacturing sites, whether a compression bond is too weak is traditionally determined by visual inspection for indentations of ACF particles, not by quantitative determination based on electrical characteristics. The inventors therefore studied a technique for conducting determinations based on electrical characteristics.

The technique described in Patent Document 1 requires that a wiring pattern for the monitoring terminals be formed on a TFT substrate independently of a wiring pattern for a resistor, and this requirement increases the number of wiring patterns on the TFT substrate. In addition, since a plurality of measuring pins need to be applied to the monitoring terminals before the resistance values can be measured, the measurement of the resistance values is likely to be a troublesome and time-consuming task.

Some of typical features and characteristics of the present invention are briefly described as follows: On a TFT substrate, a display device includes a driver IC 3, which has a first bump and a second bump, a first terminal and a second terminal, which are connected respectively to the first bump and the second bump, and wiring 2, which interconnects the first terminal and the second terminal. The driver IC includes a resistance detection circuit that detects resistance between the first bump and the second bump.

With the above display device, a weak compression bond state can be easily detected.

DESCRIPTION OF THE PREFERRED EMBODIMENTS

Hereunder, an example and modifications of the present invention will be described referring to the accompanying drawings. Elements having the same function in all drawings shown to describe the example and the modifications are each assigned the same reference number, and repeated description of these elements is omitted herein.

Figure 1:
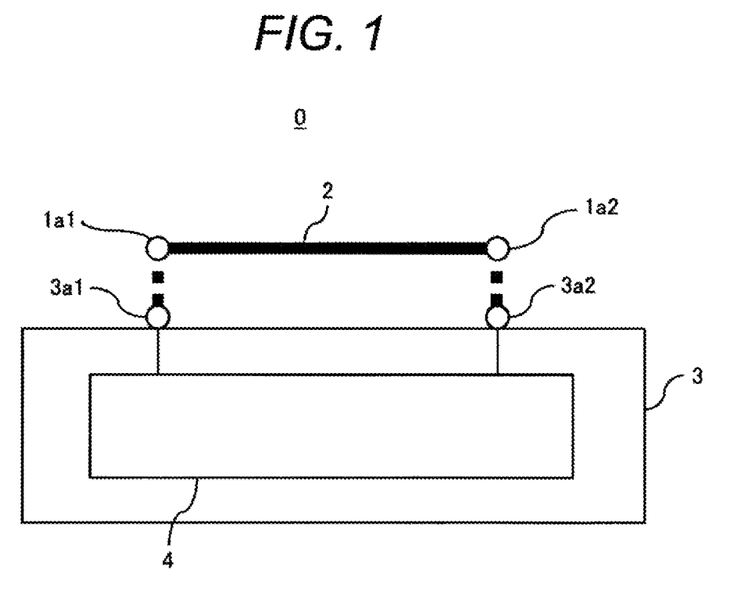
FIG. 1 is a diagram showing a configuration of a liquid-crystal display device according to an embodiment of the present invention.

FIG. 1 is a diagram showing a configuration of a liquid-crystal display device according to an embodiment of the present invention. On a TFT substrate, the display device 0 includes a driver IC 3, which has a first bump 3a1 and a second bump 3a2, a first terminal 1a1 and a second terminal 1a2, which are connected respectively to the first bump 3a1 and the second bump 3a2, and wiring 2, which interconnects the first terminal 1a1 and the second terminal 1a2. The driver IC 3, the first and second bumps 3a1, 3a2, the first and second terminals 1a1, 1a2, and the wiring 2 are arranged on the TFT substrate. The driver IC 3 also includes a resistance detection circuit 4 that detects resistance between the first bump 3a1 and the second bump 3a2.

A weak compression bond state can be easily detected by detecting the resistance developed between the first bump 3a1 and the second bump 3a2.

Example

While a liquid-crystal display device is described as an example below, the present invention can also be applied to other types of display devices such as an organic electroluminescent (EL) display device.

(Overall Device Configuration)

Figure 2:
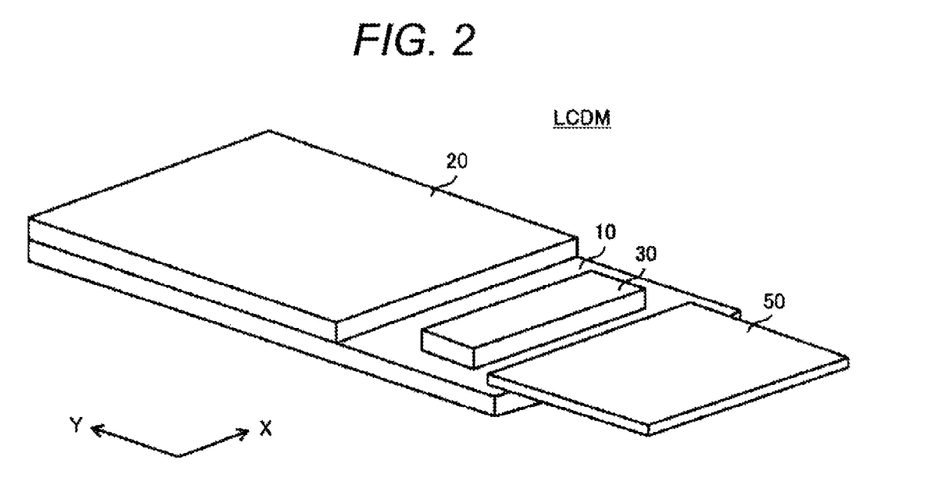
FIG. 2 is a schematic showing a basic configuration of a liquid-crystal display device according to an example.

FIG. 2 is a schematic for describing an overall configuration of a liquid-crystal display device according to an example. FIG. 2 shows a liquid-crystal display module (LCDM) used in, for example, a cell phone, a smartphone, a tablet terminal, and other handheld information terminals. Referring to FIG. 2, an opposing substrate 20 is stacked on the TFT substrate 10 formed in matrix-like fashion with elements such as pixel electrodes and thin-film transistors (TFTs). On the opposing substrate 20, a color filter is formed in correspondence with the pixel electrodes of the TFT substrate 10, whereby color images are then formed. A liquid-crystal layer is sandwiched between the TFT substrate 10 and the opposing substrate 20. Images are formed by way of transmittance control of light on a pixel-by-pixel basis according to particular orientations of the liquid-crystal molecules. The TFT substrate 10 and the opposing substrate 20 work together to form a display region.

A plurality of image signal lines (source lines) extending in a longitudinal direction (a Y-direction) and arrayed in a transverse direction (an X-direction), and a plurality of scan lines (gate lines) extending in the transverse direction and arrayed in the longitudinal direction are present on the TFT substrate 10, and pixels are formed in regions surrounded by the image signal lines and the scan lines. Each of the pixel regions mainly includes a pixel electrode and a thin-film transistor (TFT) that is a switching element. The large number of pixels thus formed in a matrix-like fashion form the display region. On the display region of the TFT substrate 10, the TFT is first formed, then an inorganic passivation film is overlaid on the TFT, and the pixel electrode is further formed on the inorganic passivation film. Such an insulating film as formed from SiN is used as the inorganic passivation film, and a transparent electroconductive film such as an indium-tin oxide (ITO) film is used as the pixel electrode. Other than a glass substrate, such an insulating substrate as made from quartz glass or plastic (resin) is used as the TFT substrate 10.

A driver IC (semiconductor integrated circuit chip) 30 for driving the image signal lines and the scan lines is placed on a section of the TFT substrate 10 that is exposed from the opposing substrate 20. A flexible printed wiring circuit (FPC) board 50 for supplying electric power, signals, and the like, from an external region is also placed on the exposed section of the TFT substrate 10.

Figure 3:
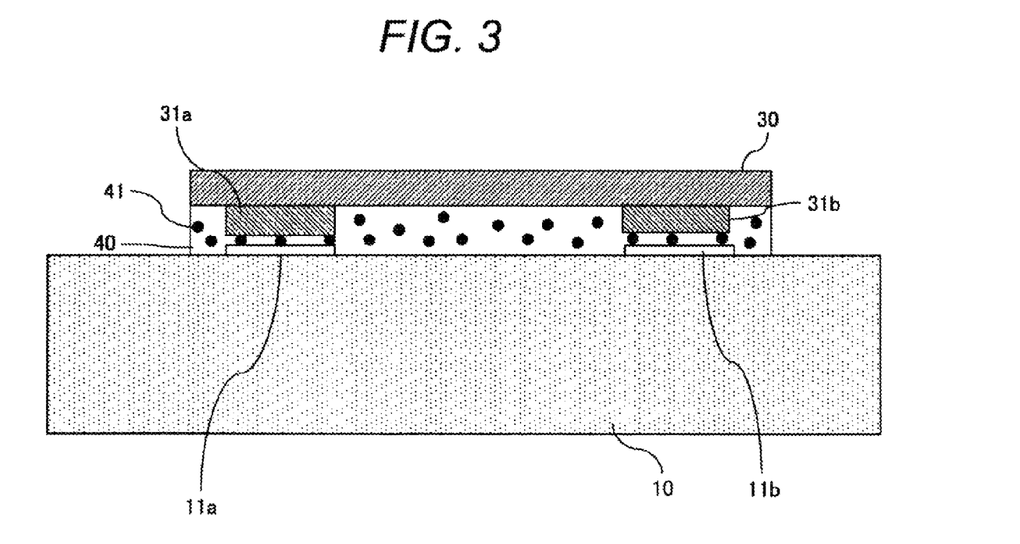
FIG. 3 is a cross-sectional view that shows connection between the liquid-crystal display device of the example and a driver IC of the liquid-crystal display device.
Figure 4A:
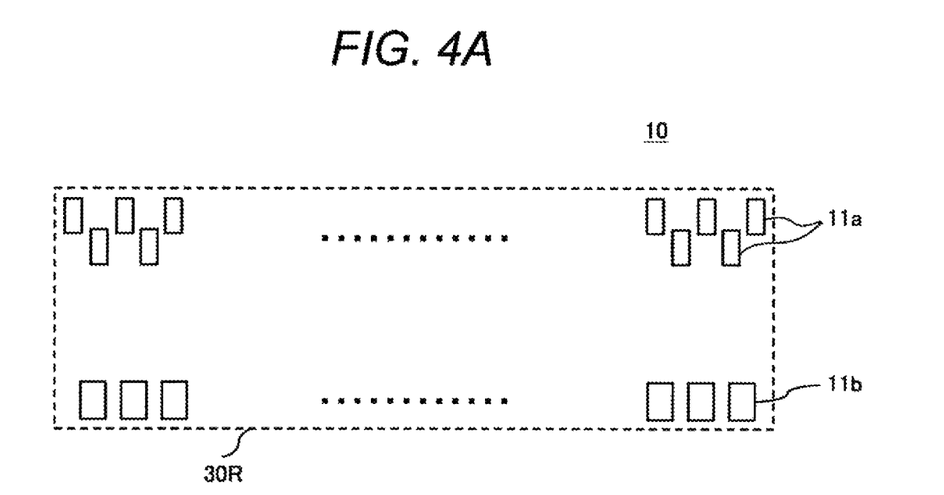
FIG. 4A is a top view showing a region to which the driver IC is connected on a TFT substrate in the example.
Figure 4B:
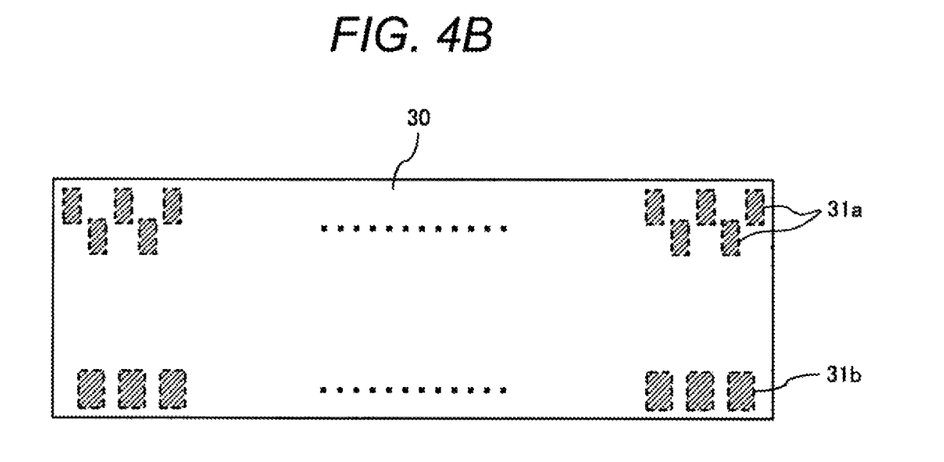
FIG. 4B is a top view of the driver IC.

FIG. 3 is a cross-sectional view that shows connection between the liquid-crystal display device of the example and the driver IC of the liquid-crystal display device. FIG. 4A is a top view showing a region to which the driver IC is connected on the TFT substrate. FIG. 4B is a top view of the driver IC. As shown in FIG. 3, the driver IC 30 is connected to terminals 11a and 11b formed on the TFT substrate 10, with an anisotropic conductive film (ACF) 40 in-between. Although the terminals are each formed by an interconnect metal, a contact hole, a transparent electroconductive film (ITO), and/or the like, these elements are omitted in FIG. 3. A dotted line 30R in FIG. 4A denotes the region to which the driver IC 30 is connected. Terminals 11a are of a so-called staggered arrangement in which each is shifted in position horizontally on the TFT substrate 10. As shown in FIG. 4B, bumps 31a and 31b for connection to the terminals 11a and 11b are formed on the driver IC 30, and the bumps 31a and 31b are connected to the terminals 11a and 11b on the TFT substrate 10. The connection between the bumps 31a, 31b and the terminals 11a, 11b is done via the anisotropic conductive film 40. The bumps 31a, 31b are formed on a lower surface of the driver IC 30, and thus the bumps are each denoted by a dotted line in FIG. 4B. In this way, the semiconductor integrated circuit chip is mounted directly (by means of COG bonding) on the TFT substrate such as a glass substrate.

As shown in FIG. 4B, the driver IC 30 is of a rectangular shape in plan view. In other words, the driver IC 30 has a first long side, a second long side opposed thereto, a first short side, and a second short side opposed to the first short side. Chip dimensions of the driver IC 30 are approximately 30 mm in width (in a direction of the long sides), approximately 1 to 2 mm in height (in a direction of the short sides), and approximately 170 μm in thickness.

The anisotropic conductive film 40 is a resin film with electrically conductive particles 41 dispersed therein. When the driver IC 30 and the TFT substrate 10 are compressively bonded together, the bumps 31a, 31b and the terminals 11a, 11b are electrically interconnected via the electroconductive particles 41.

As described above, the liquid-crystal display device of the present example includes a display region on which a plurality of scan lines, a plurality of image signal lines crossing the scan lines, and a plurality of pixels are formed, and a terminal group formed outside the display region. The terminal group includes a plurality of terminals 11a that each supply a signal to any one or both of the scan lines and the image signal lines via terminal wiring, and a plurality of terminals 11b that are connected to the FPC 50.

(Wiring for Resistance Detection)

Figure 5A:
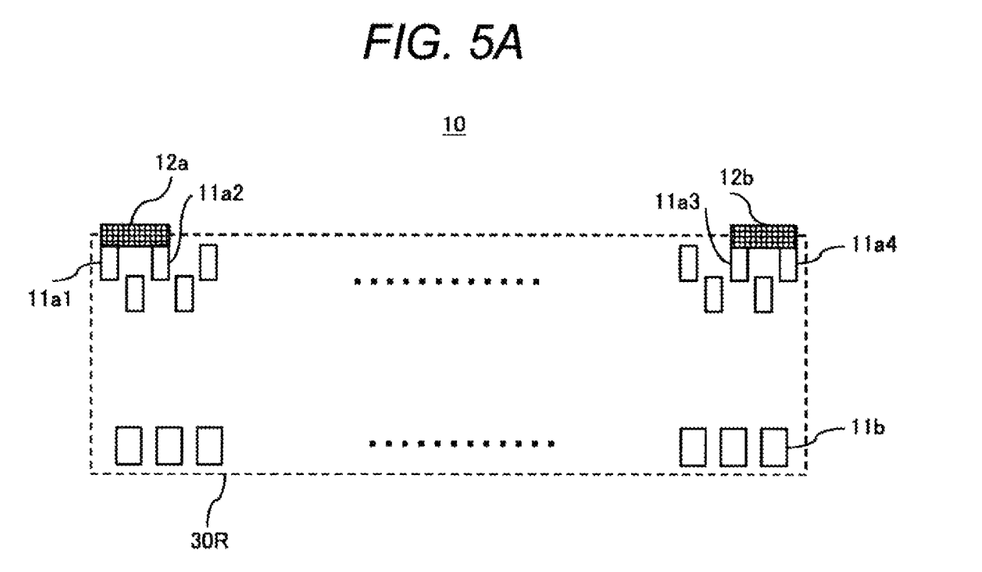
FIG. 5A is a top view that shows positions at which resistance detection wiring is formed in the example.
Figure 5B:
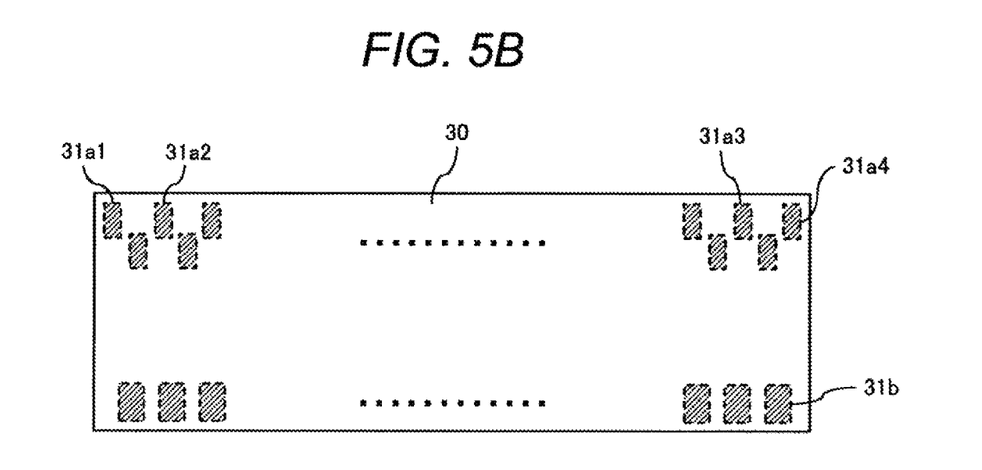
FIG. 5B is a top view that shows positions at which bumps are formed on the driver IC.

FIG. 5A is a top view that shows positions at which resistance detection wiring is formed in the example. FIG. 5B is a top view that shows positions at which bumps are formed on the driver IC in the example.

First wiring 12a is formed on the TFT substrate 10 and connected to a first terminal 11a1 that is close to and located at a very left edge of the display region, and to a second terminal 11a2 adjacent to the first terminal 11a1. Second wiring 12b is formed on the TFT substrate 10 and connected to a fourth terminal 11a4 that is close to and located at a very right edge of the display region, and to a third terminal 11a3 adjacent to the fourth terminal 11a4. The first wiring 12a and the second wiring 12b can be of any shape. The first wiring 12a and the second wiring 12b preferably have the same length and width so that the same resistance value can be obtained. In addition, the first wiring 12a and the second wiring 12b are arranged at positions where they do not intersect or merge with other lines such as the scan lines or the image signal lines. When a first bump 31a1 and second bump 31a2 on the driver IC 30 are connected to terminals 11a1 and 11a2, respectively, the bump 31a1 and the bump 31a2 adjacent thereto are connected via the wiring 12a. When a third bump 31a3 and fourth bump 31a4 on the driver IC 30 are connected to terminals 11a3 and 11a4, respectively, the bump 31a3 and the bump 31a4 adjacent thereto are connected via the wiring 12b. The resistance detection wiring 12 (12a, 12b), although formed at two places (left and right corners), may be formed at one of the left and right corners or at a place in a middle section.

Figure 6:
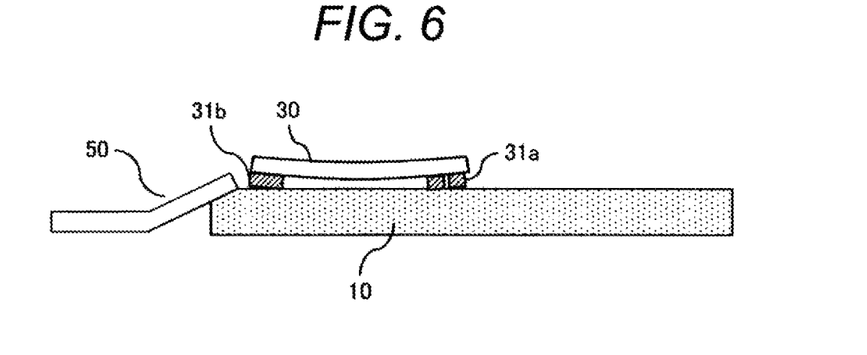
FIG. 6 is a side view of the display device in which the driver IC is mounted with a distorted short side.

FIG. 6 is a side view of the display device in which the driver IC is mounted with a distorted short side. As shown in FIG. 6, the driver IC 30 with the bumps 31a, 31b is mounted on the TFT substrate 10. In addition, the flexible printed wiring circuit (FPC) board 50 is connected to the TFT substrate 10. FIG. 6 shows the short side of the driver IC 30. As the driver IC decreases in film thickness, the driver IC tends to deflect during compression bonding and thus to decrease in a degree of the compression bond at an outside region of the output-side bump 31a that faces the display region. The input-side bump 31b (the FPC board side) has a bump area greater than that of the output-side bump 31a, so that the input-side bump 31b is less prone to decrease in the degree of the compression bond, relative to the output-side bump 31a. If the bump decreases in the degree of the compression bond as shown in FIG. 6, the adjacent bumps 31a1, 31a2 or adjacent bumps 31a3, 31a4 on the driver IC 30 will be connected with a high resistance value. The adjacent bumps 31a1, 31a2 or the adjacent bumps 31a3, 31a4 will even fail to have electrical conduction in some cases. At any rate, high resistance will be developed between the adjacent bumps 31a1 and 31a2 or the adjacent bumps 31a3 and 31a4. If the bump decreases in the degree of the compression bond, therefore, there could be caused inactivation or malfunctioning of the display device since electrical conduction will not be obtainable.

Accordingly, whether the degree of the compression bond is decreasing can be determined by measuring the resistance values between the adjacent bumps 31a1, 31a2 and between the adjacent bumps 31a3, 31a4.

(Driver IC)

Figure 7:
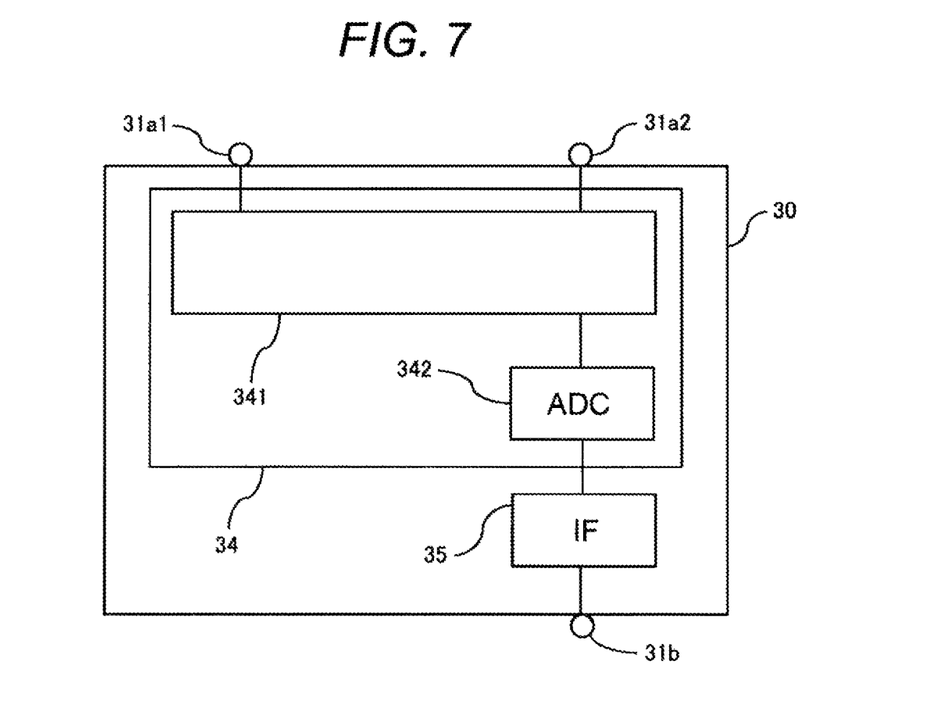
FIG. 7 is a diagram that shows circuit structure of the driver IC.
Figure 8A:
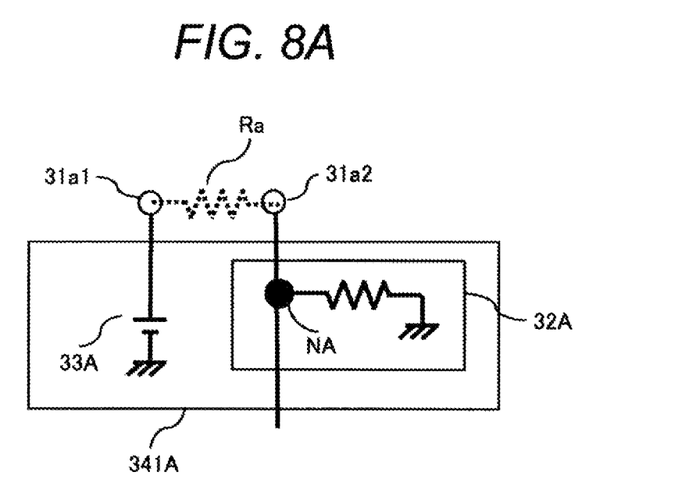
FIGS. 8A and 8B show examples of resistance detection circuit structure.
Figure 8B:
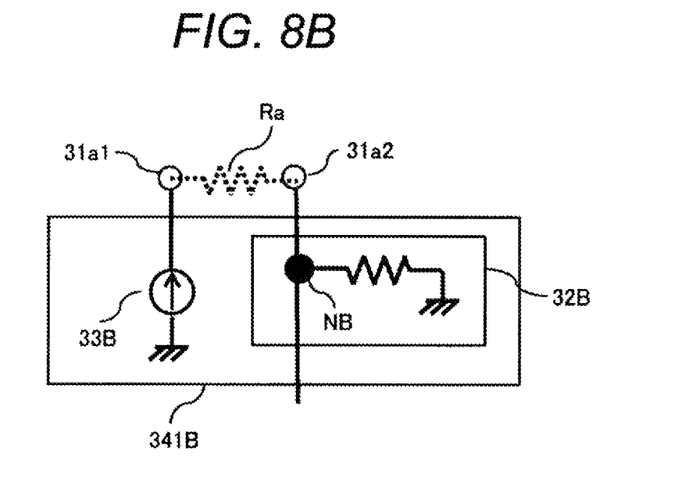

FIG. 7 is a diagram that shows circuit structure of the driver IC. FIG. 8A shows a voltage detection circuit using a voltage source, and FIG. 8B shows a voltage detection circuit using a current source. The driver IC 30 includes a bump (external terminal) 31a1, a bump (external terminal) 31a2, a resistance detection circuit 34, an interface (IF) circuit 35, and a bump (external terminal) 31b. The resistance detection circuit 34 includes a voltage detection circuit 341 and an AD converter (ADC) 342. The voltage detection circuit 341 detects as a voltage a resistance value between the bumps 31a1 and 31a2, and the AD converter 342 converts the voltage into a digital value before storing the digital value. The interface circuit 35 transmits an output value of the AD converter 342 to an external device (not shown) such as an inspection device, via the bumps 31a1 and 31a2, in which case the inspection device is an external device not included in the display device or the LCDM thereof. Whether the compression bond is weak is determined from the voltage value or a resistance value into which it has been converted by the external device. Whereas the AD converter 342 detects the voltage value in the present example, a comparator may be used to conduct comparisons with a predetermined voltage.

Two examples will be described below as exemplary configurations of the voltage detection circuit 341. As shown in FIG. 8A, a voltage detection circuit 341A that is a first example includes a voltage source 33A and a voltage divider 32A. The voltage source 33A is connected to a bump 31a1, and is further connected to a bump 31a2 via a terminal 11a1, resistance detection wiring 12, and a terminal 11a2. The bump 31a1, an ACF 40, the terminal 11a1, the resistance detection wiring 12, the terminal 11a2, another ACF 40, and the bump 31a2 compose a resistor Ra. The voltage divider 32A includes a resistive element connected to the bump 31a2 and a ground power source. A node NA is connected to an AD converter 35, and the node NA detects a voltage at the bump 31a2.

As shown in FIG. 8B, a voltage detection circuit 341B that is a second example includes a voltage source 33B and a voltage divider 32B. The voltage source 33B is connected to a bump 31a1, and is further connected to a bump 31a2 via a terminal 11a1, resistance detection wiring 12, and a terminal 11a2. The bump 31a1, an ACF 40, the terminal 11a1, the resistance detection wiring 12, the terminal 11a2, another ACF 40, and the bump 31a2 compose a resistor Ra. The voltage divider 32B includes a resistive element connected to the bump 31a2 and a ground power source. A node NB is connected to an AD converter 35, and the node NB detects a voltage at the bump 31a2.

To form the resistance detection wiring 12 in one place, such a circuit as shown in FIG. 7 suffices as the driver IC. To form the resistance detection wiring 12 in a plurality of places, however, the driver IC needs to include a plurality of resistance detection circuits. For example, to dispose the resistance detection wiring 12 in two places as shown in FIG. 5A, the driver IC 30 includes two resistance detection circuits 4. In this case, it suffices only to include one interface circuit 36 that is common to the two resistance detection circuits 4. In addition, only one common AD converter 342 needs to be included in the two resistance detection circuits 4.

Resistance (voltage) can be detected by routing interconnect lines between the terminals connected to the bumps. The resistance value (the voltage value) changes according to particular compression bonding parameters, and the changes in resistance value (voltage value) can be detected through the resistance detection circuits. When the resistance value increases (the voltage value decreases), the external device can set up an alarm and determine whether the compression bond is weak. That is to say, the bumps on the driver IC have the wiring on the TFT substrate connected, and the resistance between the bumps can be detected to determine the bumps and the terminals for insufficient compression bonds.

Compared with a conventional visual inspection method for visually determining ACF particles for indentations, a determining method based on electrical characteristics leads to improving a yield and facilitating the determination more. In case of defects, the liquid-crystal display device can eliminate causes of the defects due to indentations of the ACF particles. Additionally the facilitation of the inspection determination contributes to reducing inspection costs.

Furthermore, there is no need, as in Patent Document 1, to apply measuring pins to signal input monitoring terminals and signal output monitoring terminals. This also facilitates inspection, thus leading to reducing inspection costs.

(First Modification)

Figure 9A:
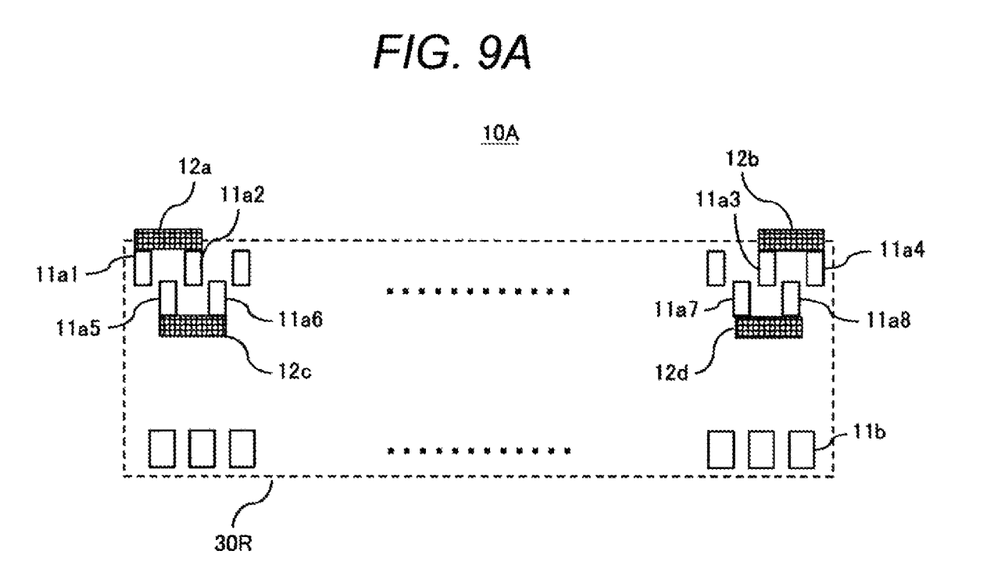
FIG. 9A is a top view that shows positions at which resistance detection wiring is formed in a first modification.
Figure 9B:
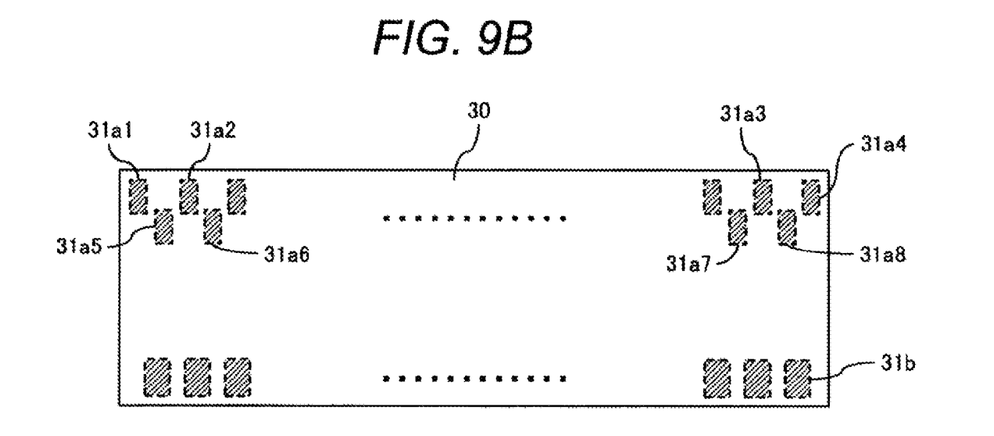
FIG. 9B is a top view that shows positions at which bumps are formed on a driver IC in the first modification.

FIG. 9A is a top view that shows positions at which resistance detection wiring is formed in a first modification. FIG. 9B is a top view that shows positions at which bumps are formed on a driver IC in the first modification. Differences from the forming positions of the resistance detection wiring in the example are described below and overlapped description of resistance detection circuits and other elements is omitted hereinafter.

The driver IC 30 has a staggered arrangement of bumps at its output side (display region side), so the driver IC also has a staggered arrangement of corresponding terminals. For this reason, in addition to the same outer (upper) terminals 11a1, 11a2, 11a3, 11a4 as those of the example, inner (lower) terminals 11a5, 11a6, 11a7, 11a8 are each wired on a TFT substrate 10A. This means that wiring 12c is formed on the TFT substrate 10A and connected to both of the terminal 11a5 located at a left side, and the terminal 11a6 adjacent to the terminal 11a5. Wiring 12d is also formed on the TFT substrate 10A and connected to both of the terminal 11a8 located at a right side, and the terminal 11a7 adjacent to the terminal 11a8. The wring 12c and the wring 12d can have any shape. The wiring 12c and the wiring 12d preferably have the same length and width as those of wiring 12a, 12b so that the same resistance value can be obtained. In addition, the wiring 12a, the wiring 12b, the wiring 12c, and the wiring 12d are arranged at positions that they do not intersect or merge with other lines such as scan lines or image signal lines. When the bumps 31a5 and 31a6 on the driver IC 30 are connected to the terminals 11a5 and 11a6, respectively, the adjacent bumps 31a5, 31a6 are connected to each other via the wiring 12c. When the bumps 31a7 and 31a8 on the driver IC 30 are connected to the terminals 11a7 and 11a8, respectively, the adjacent bumps 31a7, 31a8 are connected to each other via the wiring 12d. Although one resistance detection wiring set 12 (12a, 12b, 12c, 12d) is formed at each of two places (left and right corners), the resistance detection wiring set may be formed at one of the left and right corners or at one place in a middle section.

As shown in FIG. 6, a weak compression bond tends to deflect the driver IC and hence to increase a resistance value between the outer bumps 31a1, 31a2. A ratio between the resistance value between the outer bumps 31a1, 31a2, and a resistance value between the inner bumps 31a5, 31a6, may increase as a result. The weak compression bond can be detected more accurately by detecting the ratio.

The ratio between the outer bump 31a1-31a2 resistance value and the inner bump 31a5-31a6 resistance value, and a ratio between an outer bump 31a3-31a4 resistance value and an inner bump 31a7-31a8 resistance value are used to determine whether the driver IC is too low in the degree of the compression bond.

(Second Modification)

Figure 10A:
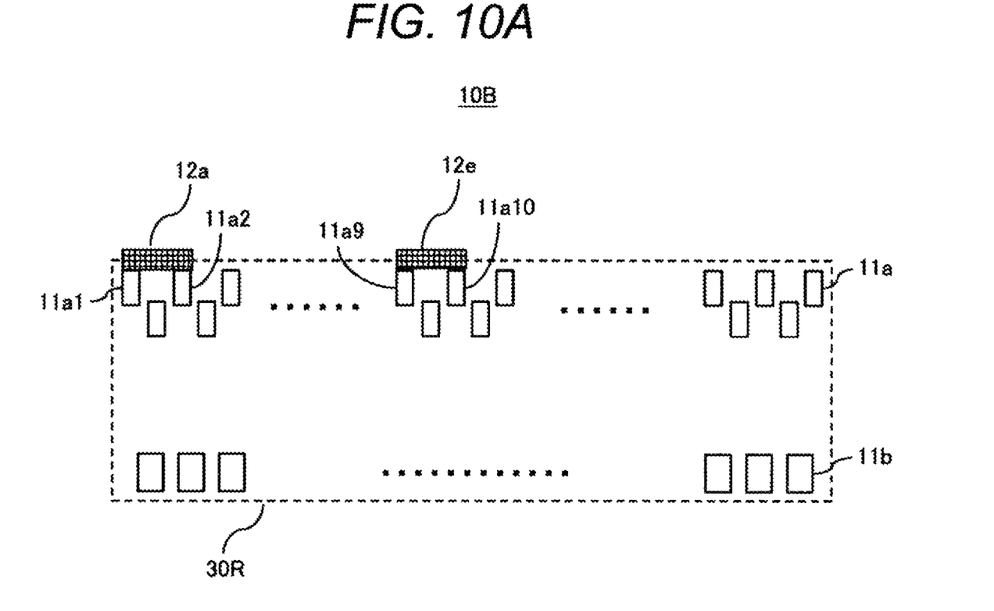
FIG. 10A is a top view that shows positions at which resistance detection wiring is formed in a second modification.
Figure 10B:
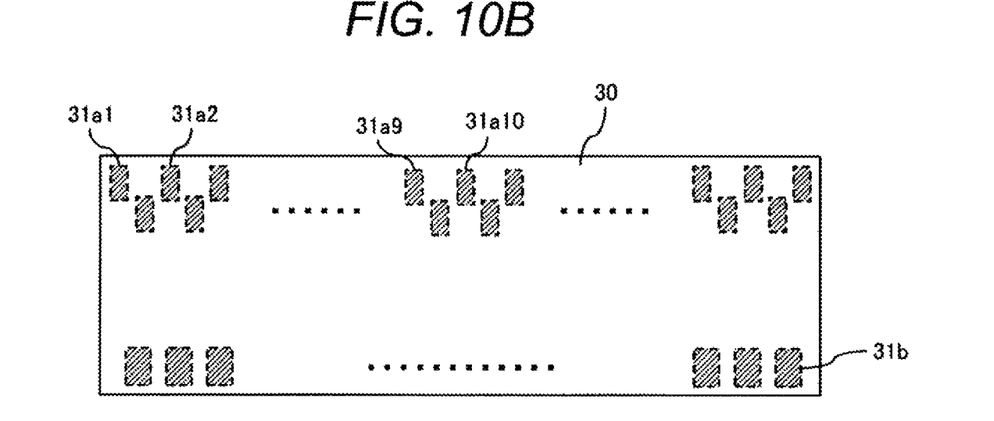
FIG. 10B is a top view that shows positions at which bumps are formed on a driver IC in the second modification.

FIG. 10A is a top view that shows positions at which resistance detection wiring is formed in a second modification. FIG. 10B is a top view that shows positions at which bumps are formed on a driver IC in the second modification. Differences from the forming positions of the resistance detection wiring in the example are described below and overlapped description of resistance detection circuits and other elements is omitted hereinafter.

Instead of the terminals 11a3, 11a4 located at right in the example, terminals 11a9, 11a10 in a middle section are wired on a TFT substrate 10B. This means that wiring 12e is formed on the TFT substrate 10B and connected to both of the terminal 11a9 positioned in the middle section, and the terminal 11a10 adjacent to the terminal 11a9. The wring 12e can have any shape. The wiring 12e preferably has the same length and width as those of wiring 12a, 12b so that the same resistance value can be obtained. In addition, the wiring 12a, the wiring 12b, and the wiring 12e are arranged at positions that they do not intersect or merge with other lines such as scan lines or image signal lines. When bumps 31a9 and 31a10 present on the driver IC 30 are connected to the terminals 11a9 and 11a10, respectively, the adjacent bumps 31a9, 31a10 are connected to each other via the wiring 12e. The resistance detection wiring 12 (12a, 12e), although formed at two places (a left side and the middle section), may instead be formed at the right side and the middle section.

Figure 11:
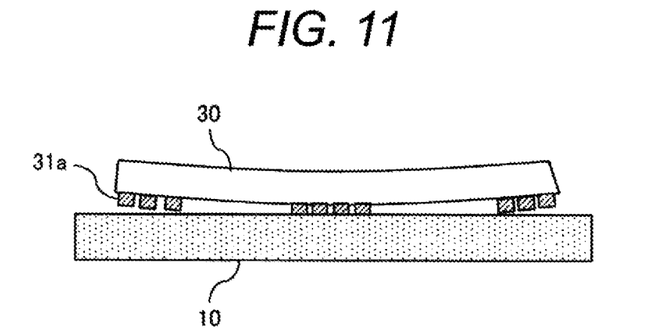
FIG. 11 is a side view of a display device in which the driver IC is mounted with a distorted long side.

FIG. 11 is a side view of a display device in which the driver IC is mounted with a distorted long side. In addition, FIG. 11 shows the long side of the driver IC 30. That is to say, FIG. 11 shows a side view of the display device as viewed from a direction of an FPC board 50. Glass stressing tends to deflect the long side of the driver IC, hence resulting in weak compression bonding at an outer region of a bump 31a, that is, at a left side or right side in FIG. 11.

In case of weak compression bonding as in FIG. 11, adjacent bumps 31a1, 31a2 on the driver IC 30 will be connected with a high resistance value. The adjacent bumps 31a1, 31a2 will even fail to have electrical conduction in some cases. At any rate, high resistance will be developed between the adjacent bumps 31a1, 31a2. If the bumps decrease in the degree of the compression bond, therefore, inactivation or malfunctioning of the display device could result since electrical conduction will not be obtainable.

Whether the decrease in the degree of the compression bond is occurring can be determined by measuring resistance values between the adjacent bumps 31a1, 31a2 and between the adjacent bumps 31a9, 31a10. A ratio between the outer bump 31a1-31a2 resistance value and the middle bump 31a9-31a10 resistance value is used to determine whether the driver IC is too low in the degree of the compression bond.

(Third Modification)

Figure 12A:
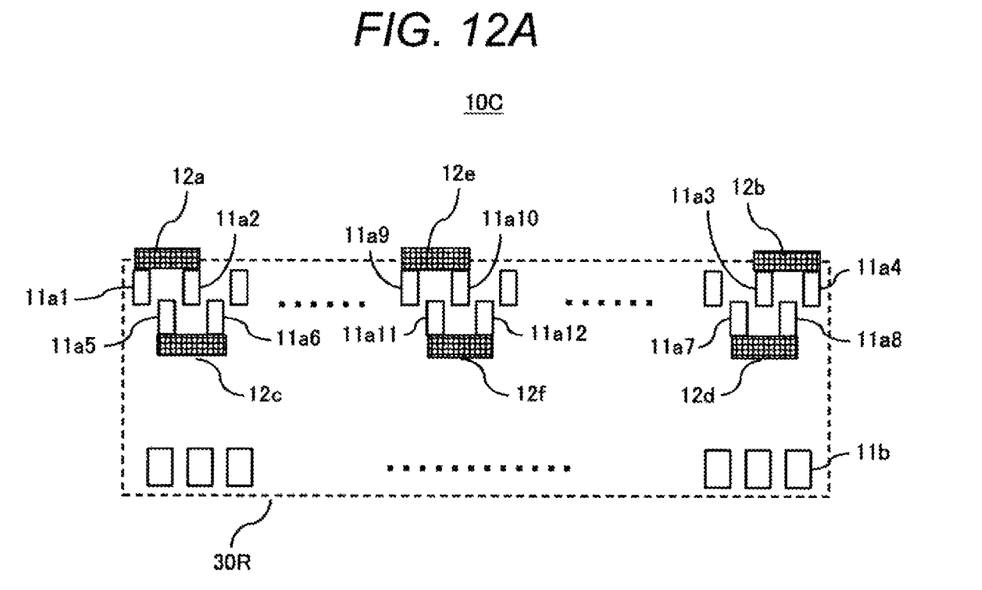
FIG. 12A is a top view that shows positions at which resistance detection wiring is formed in a third modification.
Figure 12B:
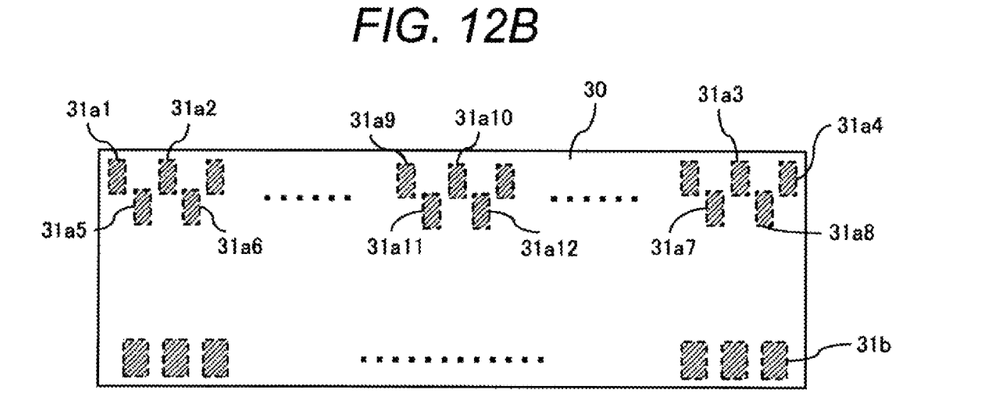
FIG. 12B is a top view that shows positions at which bumps are formed on a driver IC in the third modification.

FIG. 12A is a top view that shows positions at which resistance detection wiring is formed in a third modification. FIG. 12B is a top view that shows positions at which bumps are formed on a driver IC in the third modification. The third modification is a combination of the first modification and the second modification. Differences from the forming positions of the resistance detection wiring in the first modification and the second modification are described below and overlapped description of resistance detection circuits and other elements is omitted hereinafter.

Terminals 11a5, 11a6, 11a7, 11a8 that are located inward (downward) of the same outer (upper) terminals 11a1, 11a2, 11a3, 114 as those of the first modification, and the same terminals 11a9, 11a10 in a middle section as those of the second modification are wired on a TFT substrate 10C. In addition, terminals 11a11, 11a12 are each wired on the TFT substrate 10C. This means that wiring 12f is formed on the TFT substrate 10C and connected to both of the terminal 11a11 positioned inward (downward) in the middle section, and the terminal 11a12 adjacent to the terminal 11a11. The wring 12f can have any shape. The wiring 12f preferably has the same length and width as those of other lines such as wiring 12a, 12b so that the same resistance value can be obtained. In addition, the wirings 12a, 12b, 12c, 12d, 12e, and 12f are arranged at positions that they do not intersect or merge with other lines such as scan lines or image signal lines. When bumps 31a11 and 31a12 present on the driver IC 30 are connected to the terminals 11a11 and 11a12, respectively, the adjacent bumps 31a11, 31a12 are connected to each other via the wiring 12f.

A ratio between the outer bump 31a1-31a2 resistance value and the inner bump 31a5-31a6 resistance value, and a ratio between an outer bump 31a3-31a4 resistance value and an inner bump 31a7-31a8 resistance value are used to determine whether the driver IC is too low in the degree of a compression bond. It can thus be recognized that if the compression bond is too weak, this is due to deflection of the driver IC in a direction of a short side.

A ratio between the outer bump 31a1-31a2 resistance value and the middle bump 31a9-31a10 resistance value is used to determine whether the driver IC is too low in the degree of a compression bond. It can thus be recognized that if the compression bond is too weak, this is due to deflection of the driver IC in a direction of a long side.

While the invention by the present inventors has been described in detail above in accordance with the embodiment, example, and modifications of the invention, it goes without saying that the invention may be further changed or modified without being limited to the embodiment, the example, and the modifications.

What is claimed is:

1. A display device comprising:
   a TFT substrate that includes a first terminal, a second terminal adjacent to the first terminal, and a first wiring;
   a counter substrate; and
   a driver IC, wherein the driver IC includes a first bump and a second bump;
   wherein the first terminal and the second terminal are connected to the first bump and second bump, respectively, of the driver IC;
   wherein the first terminal, the second terminal, and the first wiring are overlapped with the driver IC;
   wherein the first wiring electrically interconnects between the first and second terminals; and
   wherein the driver IC further includes a first resistance detection circuit that detects resistance between the first bump and the second bump for detecting a connection of the first and second bump.

2. The display device according to claim 1, wherein:
   the driver IC further includes a first long side, a second long side opposed to the first long side, a first short side, and a second short side opposed to the first short side;
   the bumps on the driver IC are arranged in staggered form along the first long side;
   the first bump and the second bump are arranged at a side close to the first long side; and
   the first bump is disposed adjacently to the second bump.

3. The display device according to claim 2, wherein:
   the TFT substrate further includes a third terminal, a fourth terminal, and a second wiring that electrically connects between the third and fourth terminals;
   the driver IC further includes a third bump and a fourth bump, which are connected to the third bump and the fourth bump, respectively, the IC further including a second resistance detection circuit that detects resistance between the third bump and the fourth bump; and
   wherein the third terminal, a fourth terminal and the second wiring are overlapped with the driver IC.

4. The display device according to claim 3, wherein:
   the third bump and the fourth bump are arranged at a side close to the first long side;
   the third bump is disposed adjacently to the fourth bump; and
   the third bump and the fourth bump are arranged at the second short side.

5. The display device according to claim 4, wherein:
   the TFT substrate further includes fifth to eighth terminals, a third wiring that connects between the fifth and sixth terminals, and a fourth wiring that electrically connects between the seventh and eighth terminals;
   the driver IC further includes fifth to eighth bumps connected respectively to the fifth to eighth terminals, a third resistance detection circuit that detects resistance between the fifth bump and the sixth bump, and a fourth resistance detection circuit that detects resistance between the seventh bump and the eighth bump; and
   wherein the fifth to eighth terminals are overlapped with the driver IC.

6. The display device according to claim 5, wherein:
   the fifth to eighth bumps are each arranged at a side remote from the first long side;
   the fifth bump is disposed adjacently to the sixth bump;
   the sixth bump is disposed adjacently to the seventh bump;
   the fifth and sixth bumps are disposed adjacently to the first and second bumps, respectively; and
   the seventh and eighth bumps are disposed adjacently to the third and fourth bumps, respectively.

7. An inspection system comprising the display device of claim 6 and an external device, wherein:
   the external device determines a weak compression bond state from detection results by the first resistance detection circuit and detection results by the second resistance detection circuit.

8. The inspection system according to claim 7, wherein:
   the external device determines a weak compression bond state from detection results by the third resistance detection circuit and detection results by the fourth resistance detection circuit.

9. The display device according to claim 2, wherein:
the TFT substrate further includes a ninth terminal, a tenth terminal, and a fifth wiring that electrically connects between the ninth and tenth terminals;
the driver IC further includes ninth and tenth bumps connected respectively to the ninth and tenth terminals, a fifth resistance detection circuit that detects resistance between the ninth bump and the tenth bump; and
wherein the ninth terminal, the tenth terminal, and the fifth wiring are overlapped with the driver IC.

10. The display device according to claim 9, wherein:
the ninth and tenth bumps are arranged at a side close to the first long side;
the ninth bump is disposed adjacently to the tenth bump; and
the ninth and tenth bumps are arranged in a middle section along the first long side.

11. An inspection system comprising the display device of claim 10 and an external device, wherein:
the external device determines a weak compression bond state from detection results by the first resistance detection circuit and detection results by the fifth resistance detection circuit.

12. The display device according to claim 6, wherein:
the TFT substrate further includes ninth to twelfth terminals, a fifth wiring that electrically connects between the ninth and tenth terminals, and a sixth wiring that electrically connects between the eleventh and twelfth terminals;
the driver IC further includes ninth to twelfth bumps connected respectively to the ninth to twelfth terminals, a fifth resistance detection circuit that detects resistance between the ninth bump and the tenth bump, and a sixth resistance detection circuit that detects resistance between the eleventh bump and the twelfth bump; and
wherein the ninth to twelfth terminals are overlapped with the driver IC.

13. The display device according to claim 9, wherein:
the ninth and tenth bumps are arranged at a side close to the first long side;
the ninth bump is disposed adjacently to the tenth bump;
the ninth and tenth bumps are arranged in a middle section along the first long side;
the eleventh and twelfth bumps are each arranged at a side remote from the first long side;
the eleventh bump is disposed adjacently to the twelfth bump; and
the eleventh and twelfth bumps are disposed adjacently to the ninth and tenth bumps, respectively.

14. An inspection system comprising the display device of claim 13 and an external device, wherein:
the external device determines a weak compression bond state from detection results by the first resistance detection circuit, detection results by the third resistance detection circuit, and detection results by the fifth resistance detection circuit.

15. The inspection system according to claim 14, wherein:
the external device determines a weak compression bond state from detection results by the second resistance detection circuit, detection results by the fourth resistance detection circuit, and detection results by the fifth resistance detection circuit.

16. A driver IC mounted by COG bonding on a TFT substrate including a first terminal, a second terminal, a third terminal and a first wiring that connects the first and second terminals, the driver IC comprising:
a first long side;
a second long side opposed to the first long side;
a first short side;
a second short side opposed to the first short side;
a first bump connected to the first terminal;
a second bump connected to the second terminal;
a third bump connected to the third terminal; and
a first resistance detection circuit that detects resistance between the first bump and the second bump;
wherein the first and second bumps are arranged along the first long side and the first bump is adjacent to the second bump, and the third terminal is arranged along the second long side,
wherein the first wiring electrically interconnects between the first and second terminals, the third terminal is electrically connected to the first terminal and the second terminal, and
wherein the first wiring is overlapped with the driver IC.

17. The display device according to claim 16, wherein the first resistance detection circuit further includes a voltage detection circuit and an AD converter, and
wherein the voltage detection circuit detects as a voltage a resistance value between the first bump and the second bump, and the AD converter converts a voltage into a digital value before storing the digital value.

18. The display device according to claim 17, wherein the driver IC further includes an interface circuit that transmits an output value of the AD converter to the third bump.

* * * * *